United States Patent
Liu et al.

(10) Patent No.: US 10,103,843 B1
(45) Date of Patent: Oct. 16, 2018

(54) ON THE FLY INTERLEAVING/RATE MATCHING AND DEINTERLEAVING/DE-RATE MATCHING FOR 5G NR

(71) Applicant: QUALCOMM Incorporated, San Diego, CA (US)

(72) Inventors: Cunzhen Liu, San Diego, CA (US); Alessandro Risso, San Diego, CA (US); Li Zhang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/836,309

(22) Filed: Dec. 8, 2017

(51) Int. Cl.
*H04L 1/00* (2006.01)
*H03M 13/27* (2006.01)

(52) U.S. Cl.
CPC .......... *H04L 1/0071* (2013.01); *H04L 1/0054* (2013.01); *H04L 1/0066* (2013.01); *H04L 1/0067* (2013.01)

(58) Field of Classification Search
CPC ....... H04L 1/00; H04L 1/0013; H04L 1/0054; H04L 1/0066; H04L 1/0067; H04L 1/0071; H03M 13/3927; H04W 4/00
See application file for complete search history.

(56) References Cited

U.S. PATENT DOCUMENTS

| | | | |
|---|---|---|---|
| 9,564,927 B2 | 2/2017 | Fonseka et al. | |
| 2009/0041110 A1* | 2/2009 | Malladi | H03M 13/2957 375/240 |
| 2010/0077265 A1* | 3/2010 | Wei | H03M 13/2775 714/701 |
| 2011/0051831 A1* | 3/2011 | Subrahmanya | H04L 1/005 375/262 |
| 2011/0145670 A1* | 6/2011 | Fan | H03M 13/2957 714/748 |

(Continued)

FOREIGN PATENT DOCUMENTS

WO    WO-201713183 A1    8/2017

OTHER PUBLICATIONS

Eduardo A., et al., "Link Adaptation Strategies for Cellular Downlink with Lowfixed-Rate D2D Underlay", A 3GPP LTE Case Study, Aug. 2014, 69 Pages.

(Continued)

*Primary Examiner* — Tri H Phan
(74) *Attorney, Agent, or Firm* — Qualcomm IP Dept.; James Hunt Yancey, Jr.

(57) ABSTRACT

In an aspect, a method of encoding data for transmission includes reading, for a block of encoded data on which interleaving and rate-matching is to be performed, the block of encoded data from a buffer, by first and second interleaving and rate matching engines operating in parallel and, starting at first and second starting points of the buffer, respectively. Encoded output data includes the interleaved and rate matched data from both engines. In another aspect, a method of decoding received data includes reading data of a log likelihood ratio (LLR) buffer, by first and second de-interleaving and de-rate matching engines, starting at first and second starting points of the LLR buffer, respectively. Decoded output data includes de-interleaved and de-rate matched data of both engines.

18 Claims, 12 Drawing Sheets

(56) References Cited

U.S. PATENT DOCUMENTS

| | | | |
|---|---|---|---|
| 2011/0280185 A1* | 11/2011 | Wu | H03M 13/2739 |
| | | | 370/328 |
| 2011/0280186 A1* | 11/2011 | Rasquinha | H03M 13/275 |
| | | | 370/328 |
| 2012/0069915 A1* | 3/2012 | Cho | H04L 1/0067 |
| | | | 375/259 |
| 2014/0241269 A1* | 8/2014 | Smee | H04W 72/042 |
| | | | 370/329 |
| 2016/0352419 A1* | 12/2016 | Fonseka | H04B 10/0793 |
| 2017/0187489 A1* | 6/2017 | Myung | H03M 13/1102 |
| 2017/0331670 A1* | 11/2017 | Parkvall | H04J 11/0079 |
| 2018/0054275 A1* | 2/2018 | Kimura | H03M 13/27 |
| 2018/0083736 A1* | 3/2018 | Manolakos | H04L 1/0057 |
| 2018/0092080 A1* | 3/2018 | Kim | H04W 72/044 |
| 2018/0175886 A1* | 6/2018 | Myung | H03M 13/1148 |

OTHER PUBLICATIONS

Femenias G., et al., "Downlink Scheduling and Resource Allocation for 5G MIMO-Multicarrier: OFDAM vs FBMC/OQAM", IEEE Access, vol. 5, 2017, pp. 13770-13786.

Sybis M., et al., "Channel Coding for Ultra-Reliable Low-Latency Communication in 5G Systems", IEEE 84th Vehicular Technology Conference, Sep. 2016, 5 Pages.

* cited by examiner

| column | 0 | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|---|
| DRM engine 0 | 0 | 1 | 2 | 3 | 4 | 5 | 6 | 7 | 8 | 9 | 10 | 11 | 12 | 13 | 14 | 15 | 16 | 17 | 18 | 19 | 20 |
| DRM engine 1 | 21 | 22 | 23 | 24 | 25 | 26 | 27 | 28 | 29 | 30 | 31 | 0 | 1 | 2 | 3 | 4 | 5 | 6 | 7 | 8 | 9 |
| DRM engine 2 | 10 | 11 | 12 | 13 | 14 | 15 | 16 | 17 | 18 | 19 | 20 | 21 | 22 | 23 | 24 | 25 | 26 | 27 | 28 | 29 | 30 |
| DRM engine 3 | 31 | 0 | 1 | 2 | 3 | 4 | 5 | 6 | 7 | 8 | 9 | 10 | 11 | 12 | 13 | 14 | 15 | 16 | 17 | 18 | 19 |
| DRM engine 4 | 20 | 21 | 22 | 23 | 24 | 25 | 26 | 27 | 28 | 29 | 30 | 31 | 0 | 1 | 2 | 3 | 4 | 5 | 6 | 7 | 8 |
| DRM engine 5 | 9 | 10 | 11 | 12 | 13 | 14 | 15 | 16 | 17 | 18 | 19 | 20 | 21 | 22 | 23 | 24 | 25 | 26 | 27 | 28 | 29 |
| DRM engine 6 | 30 | 31 | 0 | 1 | 2 | 3 | 4 | 5 | 6 | 7 | 8 | 9 | 10 | 11 | 12 | 13 | 14 | 15 | 16 | 17 | 18 |
| DRM engine 7 | 19 | 20 | 21 | 22 | 23 | 24 | 25 | 26 | 27 | 28 | 29 | 30 | 31 | 0 | 1 | 2 | 3 | 4 | 5 | 6 | 7 |

| column | 0 | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|---|
| DRM engine 0 | 16 | 17 | 18 | 19 | 20 | 21 | 22 | 23 | 24 | 25 | 26 | 27 | 28 | 29 | 30 | 31 | 0 | 1 | 2 | 3 | 4 |
| DRM engine 1 | 5 | 6 | 7 | 8 | 9 | 10 | 11 | 12 | 13 | 14 | 15 | 16 | 17 | 18 | 19 | 20 | 21 | 22 | 23 | 24 | 25 |
| DRM engine 2 | 26 | 27 | 28 | 29 | 30 | 31 | 0 | 1 | 2 | 3 | 4 | 5 | 6 | 7 | 8 | 9 | 10 | 11 | 12 | 13 | 14 |
| DRM engine 3 | 15 | 16 | 17 | 18 | 19 | 20 | 21 | 22 | 23 | 24 | 25 | 26 | 27 | 28 | 29 | 30 | 31 | 0 | 1 | 2 | 3 |
| DRM engine 4 | 4 | 5 | 6 | 7 | 8 | 9 | 10 | 11 | 12 | 13 | 14 | 15 | 16 | 17 | 18 | 19 | 20 | 21 | 22 | 23 | 24 |
| DRM engine 5 | 25 | 26 | 27 | 28 | 29 | 30 | 31 | 0 | 1 | 2 | 3 | 4 | 5 | 6 | 7 | 8 | 9 | 10 | 11 | 12 | 13 |
| DRM engine 6 | 14 | 15 | 16 | 17 | 18 | 19 | 20 | 21 | 22 | 23 | 24 | 25 | 26 | 27 | 28 | 29 | 30 | 31 | 0 | 1 | 2 |
| DRM engine 7 | 3 | 4 | 5 | 6 | 7 | 8 | 9 | 10 | 11 | 12 | 13 | 14 | 15 | 16 | 17 | 18 | 19 | 20 | 21 | 22 | 23 |

| column | 0 | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|---|
| DRM engine 0 | 0 | 1 | 2 | 3 | 4 | 5 | 6 | 7 | 8 | 9 | 10 | 11 | 12 | 13 | 14 | 15 | 0 | 1 | 2 | 3 | 4 |
| DRM engine 1 | 5 | 6 | 7 | 8 | 9 | 10 | 11 | 12 | 13 | 14 | 15 | 0 | 1 | 2 | 3 | 4 | 5 | 6 | 7 | 8 | 9 |
| DRM engine 2 | 10 | 11 | 12 | 13 | 14 | 15 | 0 | 1 | 2 | 3 | 4 | 5 | 6 | 7 | 8 | 9 | 10 | 11 | 12 | 13 | 14 |
| DRM engine 3 | 15 | 0 | 1 | 2 | 3 | 4 | 5 | 6 | 7 | 8 | 9 | 10 | 11 | 12 | 13 | 14 | 15 | 0 | 1 | 2 | 3 |
| DRM engine 4 | 4 | 5 | 6 | 7 | 8 | 9 | 10 | 11 | 12 | 13 | 14 | 15 | 0 | 1 | 2 | 3 | 4 | 5 | 6 | 7 | 8 |
| DRM engine 5 | 9 | 10 | 11 | 12 | 13 | 14 | 15 | 0 | 1 | 2 | 3 | 4 | 5 | 6 | 7 | 8 | 9 | 10 | 11 | 12 | 13 |

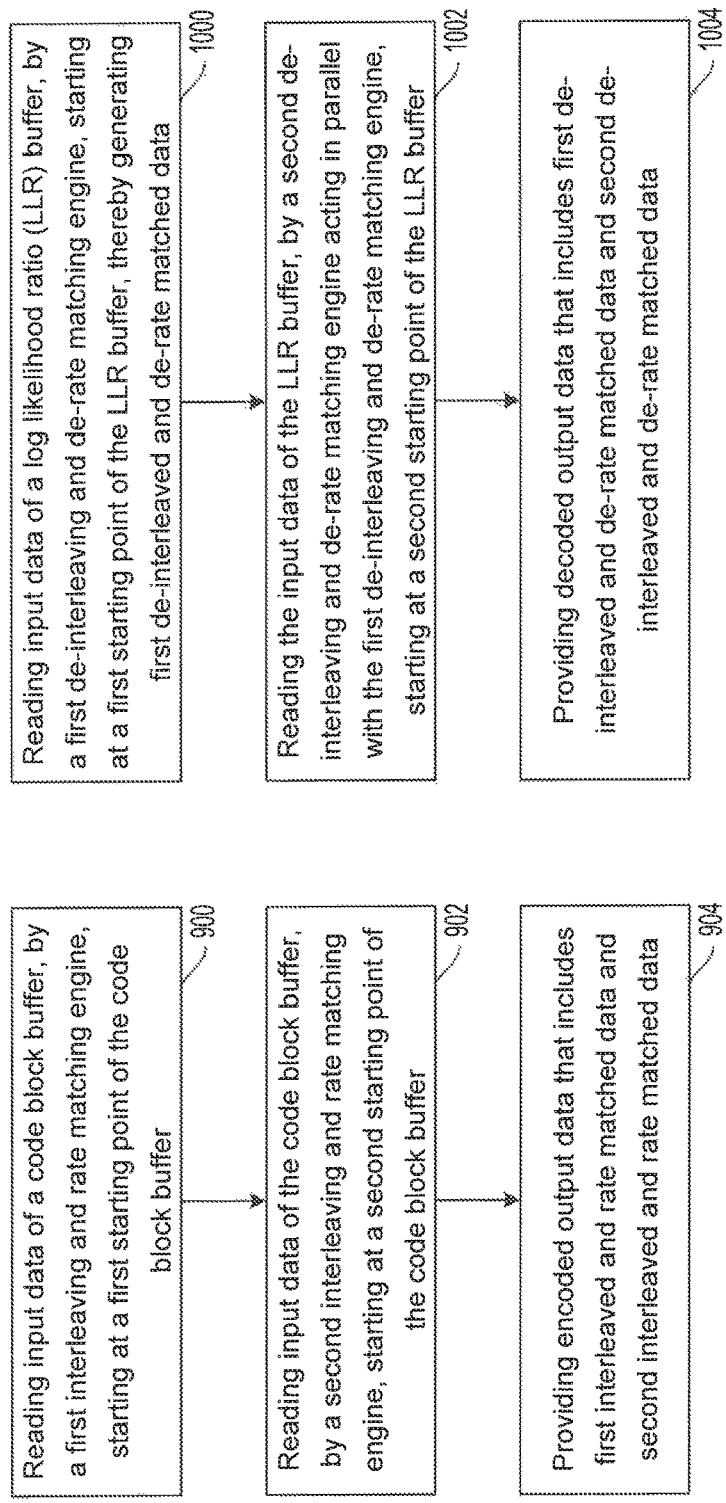

ON THE FLY INTERLEAVING/RATE MATCHING AND DEINTERLEAVING/DE-RATE MATCHING FOR 5G NR

TECHNICAL FIELD

Aspects of the present disclosure relate generally to wireless communication systems, and more particularly, to interleaving/rate-matching and deinterleaving/de-rate-matching for 5G NR. Some embodiments of the technology discussed below enable and provide techniques to save memory, reduced design foot-print size, and on-the-fly operating conditions for reduced buffer space.

INTRODUCTION

Wireless communication networks are widely deployed to provide various communication services such as voice, video, packet data, messaging, broadcast, and the like. These wireless networks may be multiple-access networks capable of supporting multiple users by sharing the available network resources. Such networks, which are usually multiple access networks, support communications for multiple users by sharing the available network resources.

A wireless communication network may include a number of base stations or node Bs that can support communication for a number of user equipments (UEs). A UE may communicate with a base station via downlink and uplink. The downlink (or forward link) refers to the communication link from the base station to the UE, and the uplink (or reverse link) refers to the communication link from the UE to the base station.

A base station may transmit data and control information on the downlink to a UE and/or may receive data and control information on the uplink from the UE. On the downlink, a transmission from the base station may encounter interference due to transmissions from neighbor base stations or from other wireless radio frequency (RF) transmitters. On the uplink, a transmission from the UE may encounter interference from uplink transmissions of other UEs communicating with the neighbor base stations or from other wireless RF transmitters. This interference may degrade performance on both the downlink and uplink.

As the demand for mobile broadband access continues to increase, the possibilities of interference and congested networks grows with more UEs accessing the long-range wireless communication networks and more short-range wireless systems being deployed in communities. Research and development continue to advance wireless communication technologies not only to meet the growing demand for mobile broadband access, but to advance and enhance the user experience with mobile communications.

BRIEF SUMMARY OF SOME EMBODIMENTS

The following summarizes some aspects of the present disclosure to provide a basic understanding of the discussed technology. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

In the 5G specification, it is currently envisioned that interleaving takes place after rate matching on the transmit side, where in LTE rate matching occurs after interleaving. There exist two schemes in interleaving: puncture and repetition. A result of implementing interleaving after rate matching, in the case of the repetition interleaving scheme, is that buffering, in a conventional way, is required for the incoming log likelihood ratios (LLRs) that are interleaved and repeated before performing de-interleaving and followed by de-repetition. With normally large number of repetition, this buffering necessitates a very large buffer resulting in a sizable area penalty for the circuitry implementation.

In one aspect of the disclosure, a method of interleaving and rate-matching for transmission is provided. For example, for a block of encoded data on which interleaving and rate-matching is to be performed, a method can include reading the block of encoded data from a buffer, by a first interleaving and rate matching engine, starting at a first starting point of the buffer, thereby generating first interleaved and rate matched data. Additionally, the method can include reading the block of encoded data from the buffer, by a second interleaving and rate matching engine acting in parallel with the first interleaving and rate matching engine, starting at a second starting point of the buffer, thereby generating second interleaved and rate matched data. Also the method can include providing encoded output data that includes the first interleaved and rate matched data and the second interleaved and rate matched data.

In another aspect, a method of decoding received data is provided. For example, a method can include reading data of a log likelihood ratio (LLR) buffer, by a first de-interleaving and de-rate matching engine, starting at a first starting point of the LLR buffer, thereby generating first de-interleaved and de-rate matched data. The method may additionally include reading the data of the LLR buffer, by a second de-interleaving and de-rate matching engine acting in parallel with the first de-interleaving and de-rate matching engine, starting at a second starting point of the LLR buffer, thereby generating second de-interleaved and de-rate matched data. The method may further include providing decoded output data that includes the first de-interleaved and de-rate matched data and the second de-interleaved and de-rate matched data.

In another aspect, an encoder is provided. For example, an encoder may include at least one processor and at least one memory couple to the at least one processor. The at least one processor is configured, for a block of encoded data on which interleaving and rate-matching is to be performed, to read the block of encoded data from a buffer, by a first interleaving and rate matching engine, starting at a first starting point of the buffer, thereby generating first interleaved and rate matched data. The at least one processor is additionally configured to read the block of encoded data from the buffer, by a second interleaving and rate matching engine acting in parallel with the first interleaving and rate matching engine, starting at a second starting point of the buffer, thereby generating second interleaved and rate matched data. The at least one processor is also configured to provide encoded output data that includes the first interleaved and rate matched data and the second interleaved and rate matched data.

In another aspect, a decoder is provided. For example, a decoder may have at least one processor and at least one memory coupled to the at least one processor. The at least one processor is configured to read data of a log likelihood ratio (LLR) buffer, by a first de-interleaving and de-rate matching engine, starting at a first starting point of the LLR buffer, thereby generating first de-interleaved and de-rate matched data. The at least one processor is additionally configured to read the data of the LLR buffer, by a second de-interleaving and de-rate matching engine acting in parallel with the first de-interleaving and de-rate matching engine, starting at a second starting point of the LLR buffer, thereby generating second de-interleaved and de-rate matched data. The at least one processor is further configured to provide decoded output data that includes the first de-interleaved and de-rate matched data and the second de-interleaved and de-rate matched data.

Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

A further understanding of the nature and advantages of the present disclosure may be realized by reference to the following drawings. In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

FIGS. 3A and 3B are block diagrams conceptually illustrating memory of an interleaver and/or de-interleaver according to some embodiments of the present disclosure.

FIG. 5 is a block diagram conceptually illustrating another memory of an interleaver and/or de-interleaver according to some embodiments of the present disclosure.

FIG. 9 is a block diagram illustrating example blocks of an encoding method according to some embodiments of the present disclosure.

FIG. 10 is a block diagram illustrating example blocks of a decoding method according to some embodiments of the present disclosure.

DETAILED DESCRIPTION

Figure 1:
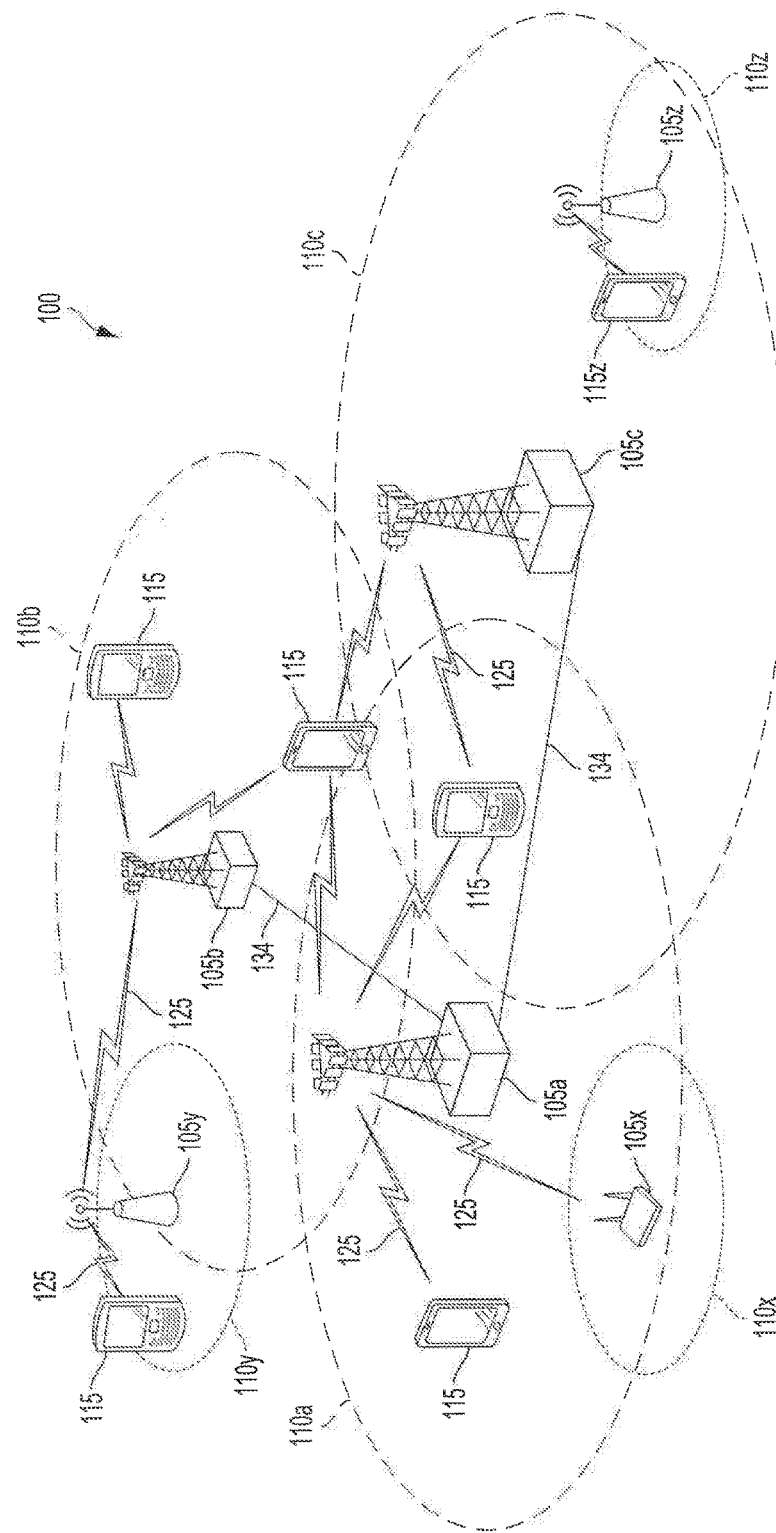
FIG. 1 is a block diagram illustrating details of a wireless communication system according to some embodiments of the present disclosure.

The detailed description set forth below, in connection with the appended drawings, is intended as a description of various possible configurations and is not intended to limit the scope of the disclosure. Rather, the detailed description includes specific details for the purpose of providing a thorough understanding of the inventive subject matter. It will be apparent to those skilled in the art that these specific details are not required in every case and that, in some instances, well-known structures and components are shown in block diagram form for clarity of presentation.

This disclosure relates generally to providing or participating in communication as between two or more wireless devices in one or more wireless communications systems, also referred to as wireless communications networks. In various embodiments, the techniques and apparatus may be used for wireless communication networks such as code division multiple access (CDMA) networks, time division multiple access (TDMA) networks, frequency division multiple access (FDMA) networks, orthogonal FDMA (OFDMA) networks, single-carrier FDMA (SC-FDMA) networks, long term evolution (LTE) networks, Global System for Mobile Communications (GSM) networks, as well as other communications networks. As described herein, the terms "networks" and "systems" may be used interchangeably according to the particular context.

A CDMA network, for example, may implement a radio technology such as universal terrestrial radio access (UTRA), cdma2000, and the like. UTRA includes wideband-CDMA (W-CDMA) and low chip rate (LCR). CDMA2000 covers IS-2000, IS-95, and IS-856 standards.

A TDMA network may, for example implement a radio technology such as GSM. 3GPP defines standards for the GSM EDGE (enhanced data rates for GSM evolution) radio access network (RAN), also denoted as GERAN. GERAN is the radio component of GSM/EDGE, together with the network that joins the base stations (for example, the Ater and Abis interfaces) and the base station controllers (A interfaces, etc.). The radio access network represents a component of a GSM network, through which phone calls and packet data are routed from and to the public switched telephone network (PSTN) and Internet to and from subscriber handsets, also known as user terminals or user equipments (UEs). A mobile phone operator's network may comprise one or more GERANs, which may be coupled with Universal Terrestrial Radio Access Networks (UTRANs) in the case of a UMTS/GSM network. An operator network may also include one or more LTE networks, and/or one or more other networks. The various different network types may use different radio access technologies (RATs) and radio access networks (RANs).

An OFDMA network may, for example, implement a radio technology such as evolved UTRA (E-UTRA), IEEE 802.11, IEEE 802.16, IEEE 802.20, flash-OFDM and the like. UTRA, E-UTRA, and GSM are part of universal mobile telecommunication system (UMTS). In particular, LTE is a release of UMTS that uses E-UTRA. UTRA, E-UTRA, GSM, UMTS and LTE are described in documents provided from an organization named "3rd Generation Partnership Project" (3GPP), and cdma2000 is described in documents from an organization named "3rd Generation Partnership Project 2" (3GPP2). These various radio technologies and standards are known or are being developed. For example, the 3rd Generation Partnership Project (3GPP) is a collaboration between groups of telecommunications associations that aims to define a globally applicable third generation (3G) mobile phone specification. 3GPP long term evolution (LTE) is a 3GPP project aimed at improving the universal mobile telecommunications system (UMTS) mobile phone standard. The 3GPP may define specifications for the next generation of mobile networks, mobile systems, and mobile devices.

For clarity, certain aspects of the apparatus and techniques may be described below with reference to exemplary LTE implementations or in an LTE-centric way, and LTE terminology may be used as illustrative examples in portions of the description below; however, the description is not intended to be limited to LTE applications. Indeed, the present disclosure is concerned with shared access to wireless spectrum between networks using different radio access technologies or radio air interfaces.

Moreover, in operation, wireless communication networks adapted according to the concepts herein may operate with any combination of licensed or unlicensed spectrum depending on loading and availability. Accordingly, it will be apparent to one of skill in the art that the systems, apparatus and methods described herein may be applied to other communications systems and applications than the particular examples provided.

While aspects and embodiments are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, embodiments and/or uses may come about via integrated chip embodiments and/or other non-module-component based devices (e.g., end-user devices, vehicles, communication devices, computing devices, industrial equipment, retail/purchasing devices, medical devices, AI-enabled devices, etc.). While some examples may or may not be specifically directed to use cases or applications, a wide assortment of applicability of described innovations may occur. Implementations may range from chip-level or modular components to non-modular, non-chip-level implementations and further to aggregated, distributed, or OEM devices or systems incorporating one or more described aspects. In some practical settings, devices incorporating described aspects and features may also necessarily include additional components and features for implementation and practice of claimed and described embodiments. It is intended that innovations described herein may be practiced in a wide variety of implementations, including both large/small devices, chip-level components, multi-component systems (e.g. RF-chain, communication interface, processor), distributed arrangements, end-user devices, etc. of varying sizes, shapes, and constitution.

FIG. 1 shows wireless network 100 for communication according to some embodiments. While discussion of the technology of this disclosure is provided relative to an LTE-A network (shown in FIG. 1), this is for illustrative purposes. Principles of the technology disclosed can be used in other network deployments, including fifth generation (5G) networks. As appreciated by those skilled in the art, components appearing in FIG. 1 are likely to have related counterparts in other network arrangements including, for example, cellular-style network arrangements and non-cellular-style-network arrangements (e.g., device to device or peer to peer or ad hoc network arrangements, etc.).

The wireless network 100 can include a number of base stations, such as may comprise evolved node Bs (eNBs) or G node Bs (gNBs). These may be referred to as gNBs 105. A gNB may be a station that communicates with the UEs and may also be referred to as a base station, a node B, an access point, and the like. Each gNB 105 may provide communication coverage for a particular geographic area. In 3GPP, the term "cell" can refer to this particular geographic coverage area of a gNB and/or a gNB subsystem serving the coverage area, depending on the context in which the term is used. In implementations of wireless network 100 herein, gNBs 105 may be associated with a same operator or different operators (e.g., wireless network 100 may comprise a plurality of operator wireless networks), and may provide wireless communications using one or more of the same frequencies (e.g., one or more frequency band in licensed spectrum, unlicensed spectrum, or a combination thereof) as a neighboring cell.

A gNB may provide communication coverage for a macro cell or a small cell, such as a pico cell or a femto cell, and/or other types of cell. A macro cell generally covers a relatively large geographic area (e.g., several kilometers in radius) and may allow unrestricted access by UEs with service subscriptions with the network provider. A small cell, such as a pico cell, would generally cover a relatively smaller geographic area and may allow unrestricted access by UEs with service subscriptions with the network provider. A small cell, such as a femto cell, would also generally cover a relatively small geographic area (e.g., a home) and, in addition to unrestricted access, may also provide restricted access by UEs having an association with the femto cell (e.g., UEs in a closed subscriber group (CSG), UEs for users in the home, and the like). A gNB for a macro cell may be referred to as a macro gNB. A gNB for a small cell may be referred to as a small cell gNB, a pico gNB, a femto gNB or a home gNB. In the example shown in FIG. 1, gNBs 105a, 105b and 105c are macro gNBs for the macro cells 110a, 110b and 110c, respectively. gNBs 105x, 105y, and 105z are small cell gNBs, which may include pico or femto gNBs that provide service to small cells 110x, 110y, and 110z, respectively. A gNB may support one or multiple (e.g., two, three, four, and the like) cells.

Wireless network 100 may support synchronous or asynchronous operation. For synchronous operation, the gNBs may have similar frame timing, and transmissions from different gNBs may be approximately aligned in time. For asynchronous operation, the gNBs may have different frame timing, and transmissions from different gNBs may not be aligned in time. In some scenarios, networks may be enabled or configured to handle dynamic switching between synchronous or asynchronous operations.

UEs 115 are dispersed throughout wireless network 100, and each UE may be stationary or mobile. It should be appreciated that, although a mobile apparatus is commonly referred to as user equipment (UE) in standards and specifications promulgated by the 3rd Generation Partnership Project (3GPP), such apparatus may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. Within the present document, a "mobile" apparatus or UE need not necessarily have a capability to move, and may be stationary. Some non-limiting examples of a mobile apparatus, such as may comprise embodiments of one or more of UEs 115, include a mobile, a cellular (cell) phone, a smart phone, a session initiation protocol (SIP) phone, a laptop, a personal computer (PC), a notebook, a netbook, a smart book, a tablet, and a personal digital assistant (PDA). A mobile apparatus may additionally be an "Internet of things" (IoT) device such as an automotive or other transportation vehicle, a satellite radio, a global positioning system (GPS) device, a logistics controller, a drone, a multi-copter, a quad-copter, a smart energy or security device, a solar panel or solar array, municipal lighting, water, or other infrastructure; industrial automation and enterprise devices; consumer and wearable devices, such as eyewear, a wearable camera, a smart watch, a health or fitness tracker, a mammal implantable device, gesture tracking device, medical device, a digital audio player (e.g., MP3 player), a camera, a game console, etc.; and digital home or smart home devices such as a home audio, video, and multimedia device, an appliance, a sensor, a vending machine, intelligent lighting, a home security system, a smart meter, etc. A mobile apparatus, such as UEs 115, may be able to communicate with macro gNBs, pico gNBs, femto gNBs, relays, and the like. In FIG. 1, a lightning bolt (e.g., communication links 125) indicates wireless transmissions between a UE and a serving gNB, which is a gNB designated to serve the UE on the downlink and/or uplink, or desired transmission between gNBs. Although backhaul communication 134 is illustrated as wired backhaul communications that may occur between gNBs, it should be appreciated that backhaul communications may additionally or alternatively be provided by wireless communications.

Figure 2:
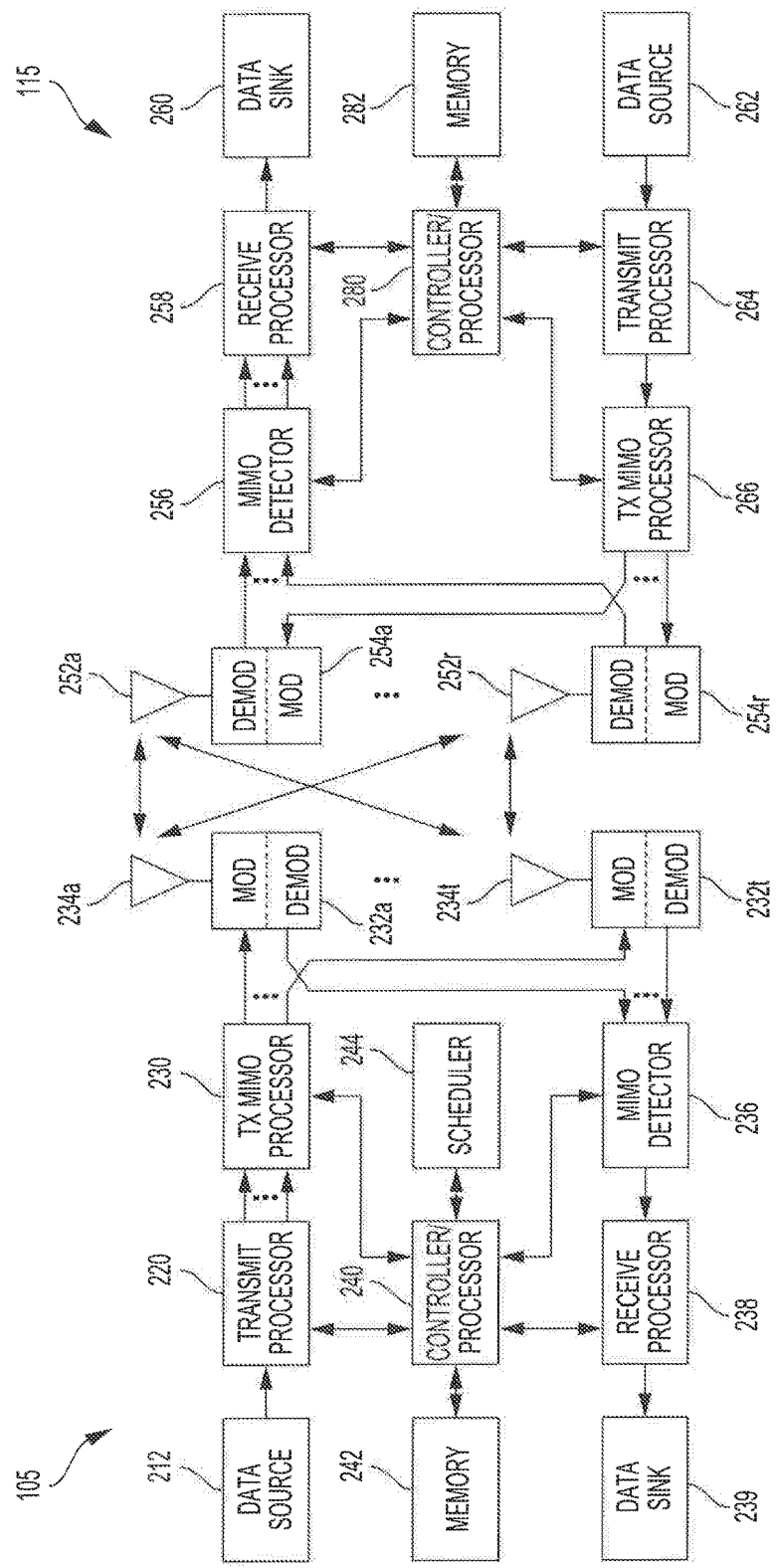
FIG. 2 is a block diagram conceptually illustrating a design of a base station/gNB and a UE configured according to some embodiments of the present disclosure.

FIG. 2 shows a block diagram of a design of base station/gNB 105 and UE 115. These can be one of the base stations/gNBs and one of the UEs in FIG. 1. For a restricted association scenario (as mentioned above), the gNB 105 may be small cell gNB 105z in FIG. 1, and UE 115 may be UE 115z, which in order to access small cell gNB 105z, would be included in a list of accessible UEs for small cell gNB 105z. gNB 105 may also be a base station of some other type. gNB 105 may be equipped with antennas 234a through 234t, and UE 115 may be equipped with antennas 252a through 252r.

At gNB 105, transmit processor 220 may receive data from data source 212 and control information from controller/processor 240. The control information may be for the physical broadcast channel (PBCH), physical control format indicator channel (PCFICH), physical hybrid-ARQ indicator channel) PHICH, physical downlink control channel (PDCCH), etc. The data may be for the physical downlink shared channel (PDSCH), etc. Transmit processor 220 may process (e.g., encode and symbol map) the data and control information to obtain data symbols and control symbols, respectively. Transmit processor 220 may also generate reference symbols, e.g., for the primary synchronization signal (PSS), secondary synchronization signal (SSS), and cell-specific reference signal (CRS). Transmit (TX) multiple-input multiple-output (MIMO) processor 230 may perform spatial processing (e.g., precoding) on the data symbols, the control symbols, and/or reference symbols, if applicable, and may provide output symbol streams to modulators (MODs) 232a through 232t. Each modulator 232 may process a respective output symbol stream (e.g., for OFDM, etc.) to obtain an output sample stream. Each modulator 232 may additionally or alternatively process (e.g., convert to analog, amplify, filter, and upconvert) the output sample stream to obtain a downlink signal. Downlink signals from modulators 232a through 232t may be transmitted via antennas 234a through 234t, respectively.

At UE 115, antennas 252a through 252r may receive the downlink signals from gNB 105 and may provide received signals to demodulators (DEMODs) 254a through 254r, respectively. Each demodulator 254 may condition (e.g., filter, amplify, downconvert, and digitize) a respective received signal to obtain input samples. Each demodulator 254 may further process the input samples (e.g., for OFDM, etc.) to obtain received symbols. MIMO detector 256 may obtain received symbols from all demodulators 254a through 254r, perform MIMO detection on the received symbols if applicable, and provide detected symbols. Receive processor 258 may process (e.g., demodulate, deinterleave, and decode) the detected symbols, provide decoded data for UE 115 to data sink 260, and provide decoded control information to controller/processor 280.

On the uplink, at UE 115, transmit processor 264 may receive and process data (e.g., for the PUSCH) from data source 262 and control information (e.g., for the PUCCH) from controller/processor 280. Transmit processor 264 may also generate reference symbols for a reference signal. The symbols from transmit processor 264 may be precoded by TX MIMO processor 266 if applicable, further processed by modulators 254a through 254r (e.g., for SC-FDM, etc.), and transmitted to gNB 105. At gNB 105, the uplink signals from UE 115 may be received by antennas 234, processed by demodulators 232, detected by MIMO detector 236 if applicable, and further processed by receive processor 238 to obtain decoded data and control information sent by UE 115. Processor 238 may provide the decoded data to data sink 239 and the decoded control information to controller/processor 240.

Controllers/processors 240 and 280 may direct the operation at gNB 105 and UE 115, respectively. Controller/processor 240 and/or other processors and modules at gNB 105 and/or controllers/processor 280 and/or other processors and modules at UE 115 may perform or direct the execution of various processes for the techniques described herein, such as to perform or direct the execution illustrated in FIGS. 6, 7A, 7B, 7C, 8, 9, and 10, and/or other processes for the techniques described herein. Memories 242 and 282 may store data and program codes for gNB 105 and UE 115, respectively. Scheduler 244 may schedule UEs for data transmission on the downlink and/or uplink.

As noted above, in the 5G specification, it is currently envisioned that interleaving is approached differently than LTE. As currently envisioned, in the 5G NR standard, interleaving takes place after rate matching on the transmit side. In contrast, rate matching occurs after interleaving in LTE on the transmit side. Implementing interleaving after rate matching, as in 5G, and employing a repetition rate matching scheme leads to a requirement to buffer the incoming LLRs. Given a normally large number of repetitions, this buffering necessitates a very large buffer resulting in a sizable area penalty for circuitry implementation. For example, the number of LLRs may exceed 1.5 million. At six bits per LLR, a buffer memory in excess of nine million bits is required. Thus, an efficient method and apparatus to perform deinterleaving and de-repetition on the fly to avoid paying this memory area penalty is desirable. As set forth below, this disclosure provides a technique that can reduce the required memory area for buffering LLRs by more than 98%. For example, the memory area can be as small as a single codeblock, which is 3*8448 LLRs. In this case, no multiple memory bank is needed, as a regular codeblock buffer may be used to satisfy the memory requirement.

Technology discussed in the present disclosure can address this challenge by introducing new interleaving/rate-matching and deinterleaving/de-rate-matching techniques. For example, on the transmit side (at a transmitter), multiple interleaver and rate matching engines operate in parallel to access a code block buffer at different starting points. On the receive side (at a receiver), multiple de-interleaver and de-rate matching engines act in parallel to process LLRs per each demodulated symbol at different offsets as result from being interleaved and rat-matched at the transmit side. This arrangement advantageously reduces the amount of inter-leaver memory that is required to buffer the LLRS, as described above. For example, use of ten de-interleaver and de-rate matching engines can reduce the amount of required interleaver memory to be as small as a single code block, which is 3*8448 LLRs. Accordingly, the required memory size is reduced to a fraction of that required without the multiple engine encoding/decoding techniques presented herein.

It is envisioned that interleavers having multiple engines can be configured in a variety of manners. According to one embodiment, an interleaver may be a rectangular interleaver with N number of rows, where N=Log 2(constellation_size). If each row is considered as an independent rate matching engine, for up to QAM 1024 constellation, ten independent rate matching engines can run in parallel with different starting offset. For on the fly rate matching and interleaving (i.e., transmit side), the ten engines may read the same code block buffer independently at different points. For on-the-fly de-rate matching and de-interleaving (i.e., receive side), ten engines may write de-rate matched results in the same HARQ buffer, at the same time, while combining previous data in the HARQ buffer on the fly. One resulting advantage is a savings of 98% or more of the interleaver/deinterleaver memory size. Another resulting advantage is that no multiple bank memory is needed, as any regular code block buffer can be used as a de-interleaver memory. Examples involving three or more engines, six engines, eight engines, and ten engines are presented herein.

Yet, it should be understood that use of ten engines (i.e., on-the-fly encoding or decoding modules) is presently preferred due to support of QAM 1024 being required in the 5G standard, but that any number of two or more engines may be utilized. As a general rule, the number of engines may be greater than or equal to Log 2(constellation_size). Constellation size can be as small as four, in which case the number of engines used can be two.

Turning to FIG. 3A, an example de-interleaver memory 300A for use with eight engines may be configured as a rectangular memory with QAM256 constellation having 32 coded bits with 21 columns. The LLRs per each demodulated symbol on which de-interleaving and de-rate-matching would be performed, contain those shown in various columns of the illustrated table in memory 300A (e.g., [0 21 10 31 20 9 30 19], [1 22 11 0 21 10 31 20], . . . ). The eight engines may each be configured to run on a single line with a same coded bit size 32 in parallel, but with different starting offsets. For example, an offset may be determined according to:

starting_offset=(line_index*column_number)%(coded_bits), where line_index=0, 1, 2, . . . 9. It is also envisioned that inter-engine combining may occur only when the number of coded bits is greater than or equal to the number of columns (i.e, row length) of the de-interleaver memory 300A. However, turning briefly to FIG. 5, another example de-interleaver memory 500 configured for use with six engines demonstrates that intra transmission time interval (TTI) combining and line engine combining can be performed when the number of coded bits is less than the number of columns (i.e. row length) of the de-interleaver memory 500.

Although the foregoing examples show starting from 0 with respect to a starting LLR, it should be understood that embodiments may start from any number. For example, in operation according to embodiments of the present disclosure a retransmitted LLR can start at any location, such as being offset by an e_offset amount. The starting point of each line engine in such an embodiment may thus follow the following equation:

starting_offset=(e_offset+line_index*column_number)%(coded_bits), where line_index==0, 1, 2, . . . 9. FIG. 3B shows an example de-interleaver memory 300B for use with eight engines in an example where e_offset=16, column_num=21, and coded bits=32.

Figure 4:
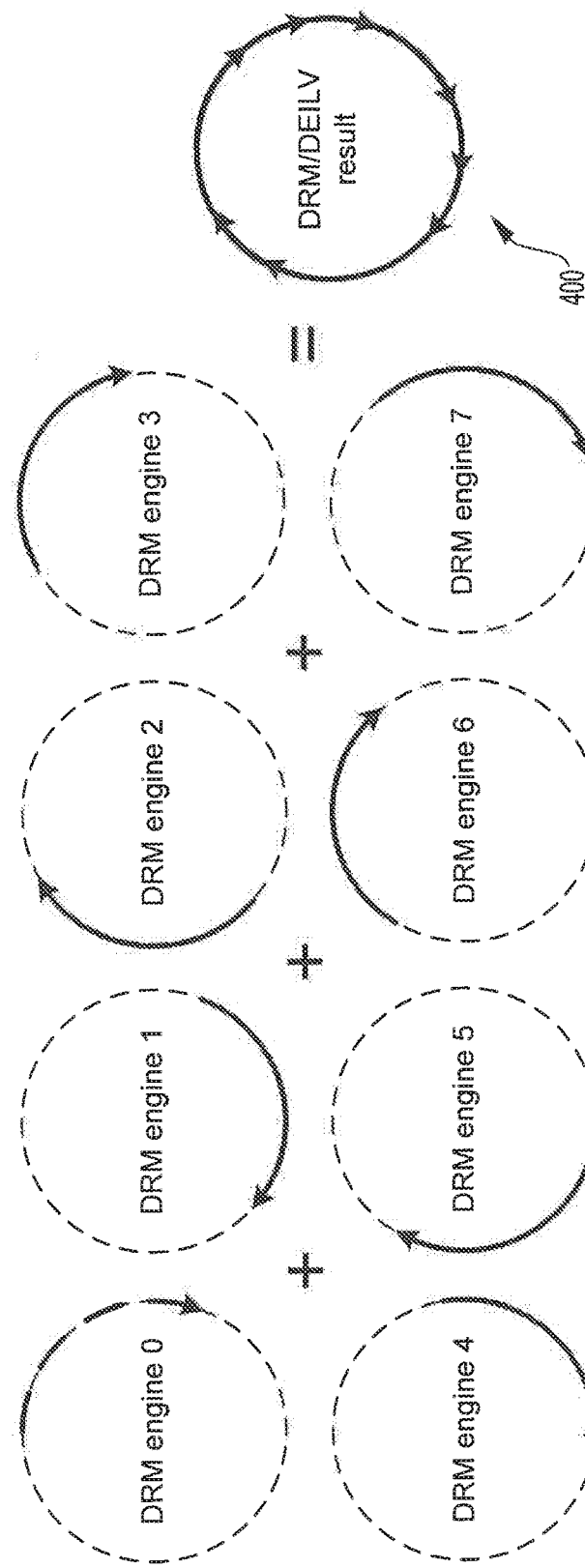
FIG. 4 is a block diagram conceptually illustrating traversal of a circular interleaver or de-interleaver memory buffer by multiple engines according to some embodiments of the present disclosure.

Turning now to FIG. 4, it is envisioned that eight de-interleaving and de-rate matching engines may be used. These engines can be combined around a circular de-interleaver memory starting from offset zero and output the final de-interleaving and de-rate matching result 400. To reduce memory usage, all of the engines may be configured to run on a same circular HARQ buffer that is 32 LLRs in width. Each engine may be configured to only access the HARQ buffer once per 32 cycles. This HARQ buffer has enough memory bandwidth to support ten engines performing read/write operations and combining on the fly by performing a read/combine/write operation on each memory line.

Figure 6:
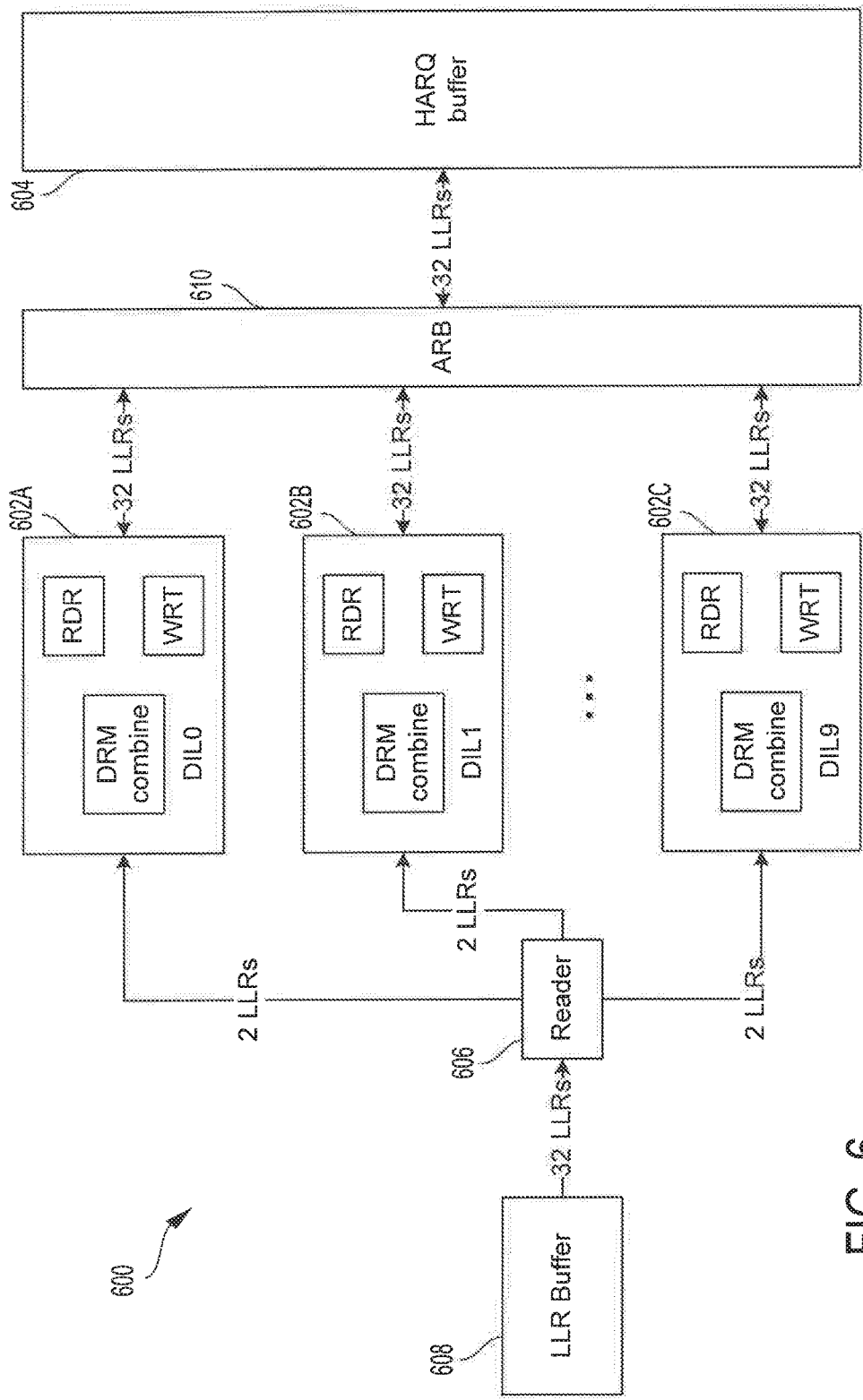
FIG. 6 is a block diagram conceptually illustrating a decoder according to some embodiments of the present disclosure.

Turning now to FIG. 6, a deinterleaver/de-rate-matcher 600 has up to ten de-interleaving and de-rate matching engines, illustrated by engines 602A, 602B, and 602C, that each have their own sets of adders for performing combining of de-rate matching results with data stored in HARQ buffer 604. In operation, a reader 606 reads thirty-two LLRs at a time from LLR buffer 608 and distributes two LLRs each cycle to each of the engines 602A-602C. In turn, read components RDR and write components WRT of each of the engines 602A-602C access HARQ buffer 604 via arbitration block 610, and each engine performs read, combine, and write operations in the HARQ buffer 604 at different starting points.

Figure 7A:
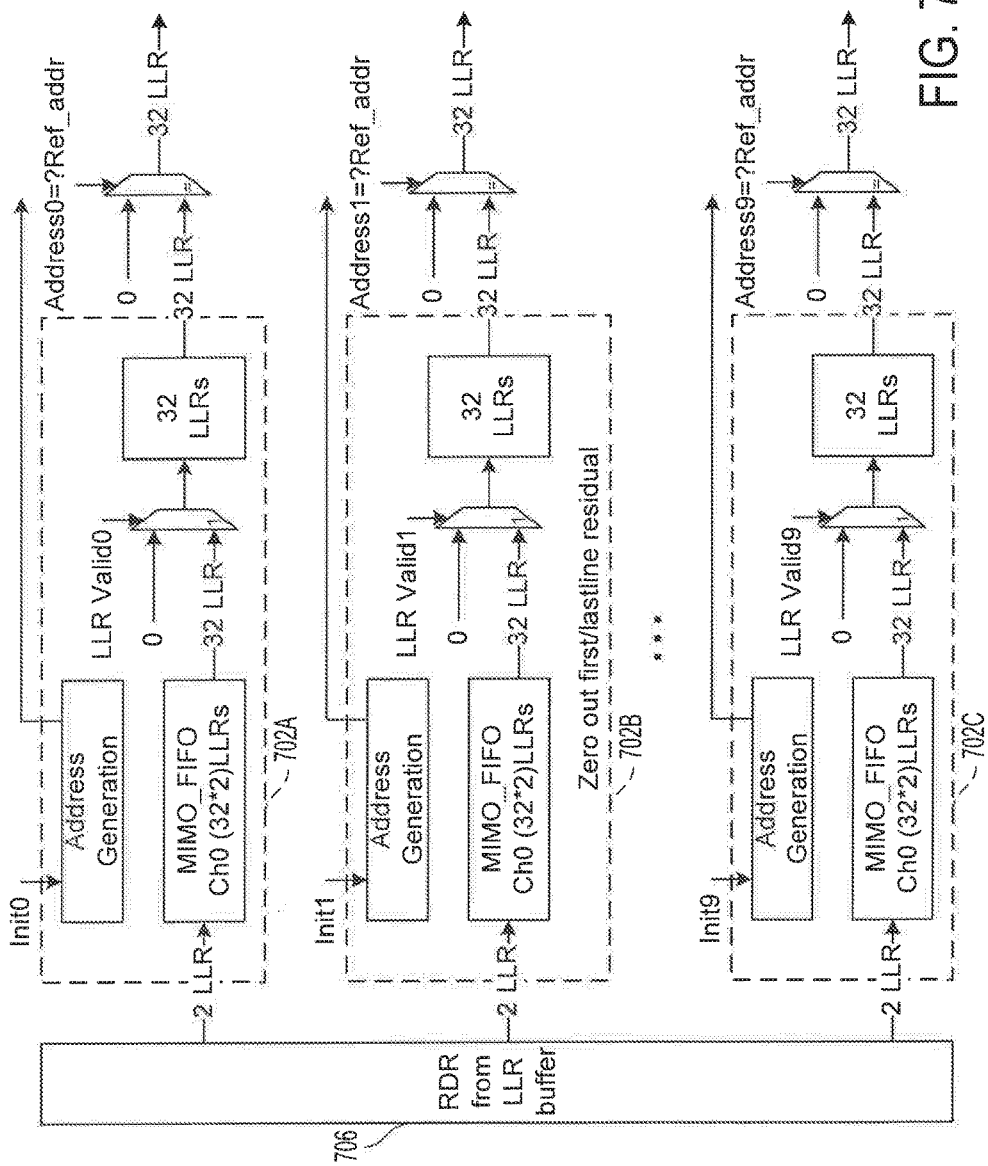
FIG. 7A is a block diagram illustrating a first part of a decoder according to some embodiments of the present disclosure.

Turning now to FIG. 7A, another implementation of a deinterleaver/de-rate-matcher has up to ten de-interleaving and de-rate matching engines, illustrated by engines 702A, 702B, and 702C, that all share adders for performing combining of de-rate matching results with data stored in HARQ buffer. Reader 706 provides two LLRs in each cycle to each of engines 702A-702C, and the engines 702A-702C store the LLRs in MIMO_FIFO registers that are each two LLRs wide and thirty-two LLRs long. De-interleaving components of engines 702A-702C operate on the received LLRs over numerous cycles to perform de-interleaving operations and arrive at de-interleaving results that are thirty-two LLRs in length.

Figure 7B:
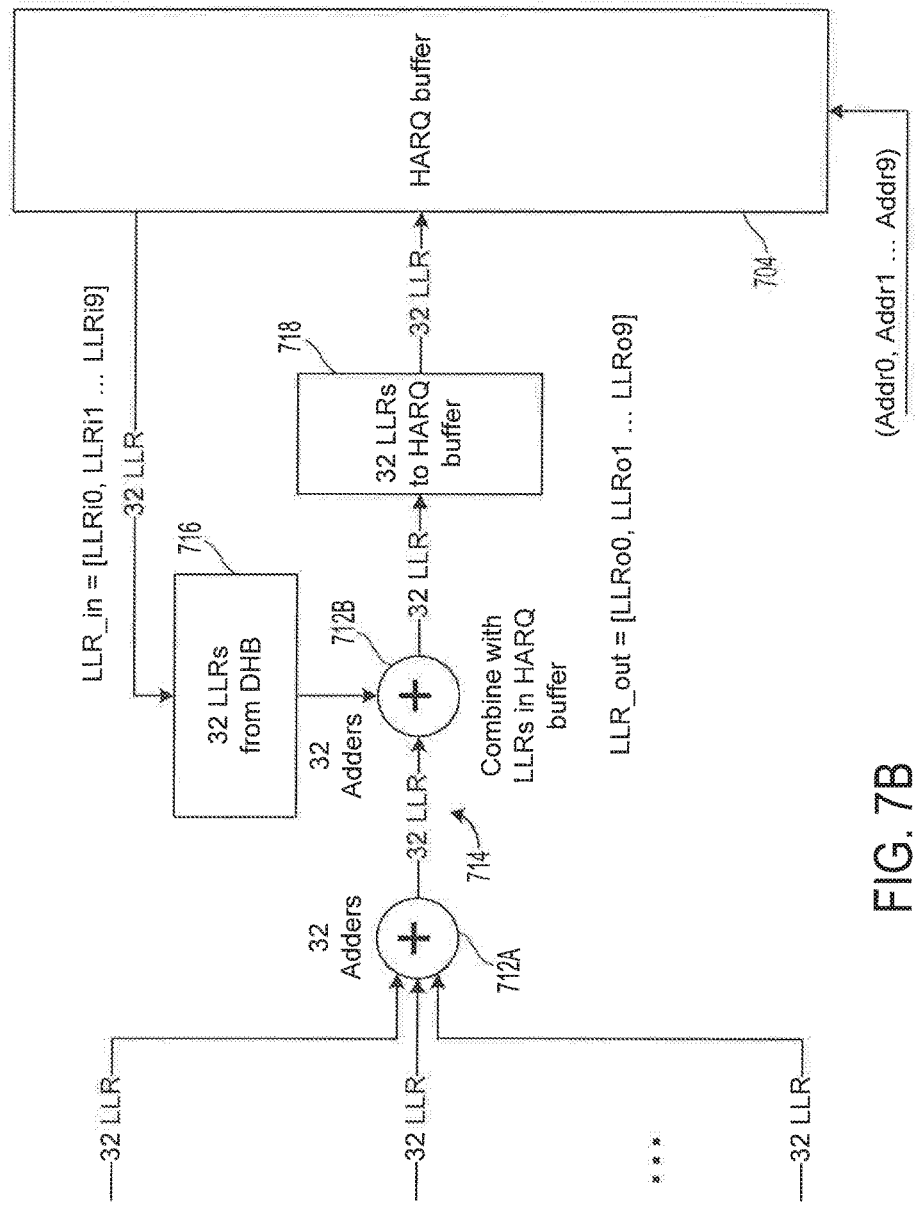
FIG. 7B is a block diagram illustrating a second part of the decoder of FIG. 7A according to some embodiments of the present disclosure.

Turning now to FIG. 7B, these engines take turns accessing the HARQ buffer 704 at different starting points and using the adders 712A and 712B to combine the de-interleaving results 714 with the data 716 already in the buffer 704. Accordingly, each engine writes de-interleaving and de-rate matching results 718 to the correct addresses in the HARQ buffer 704.

Figure 7C:
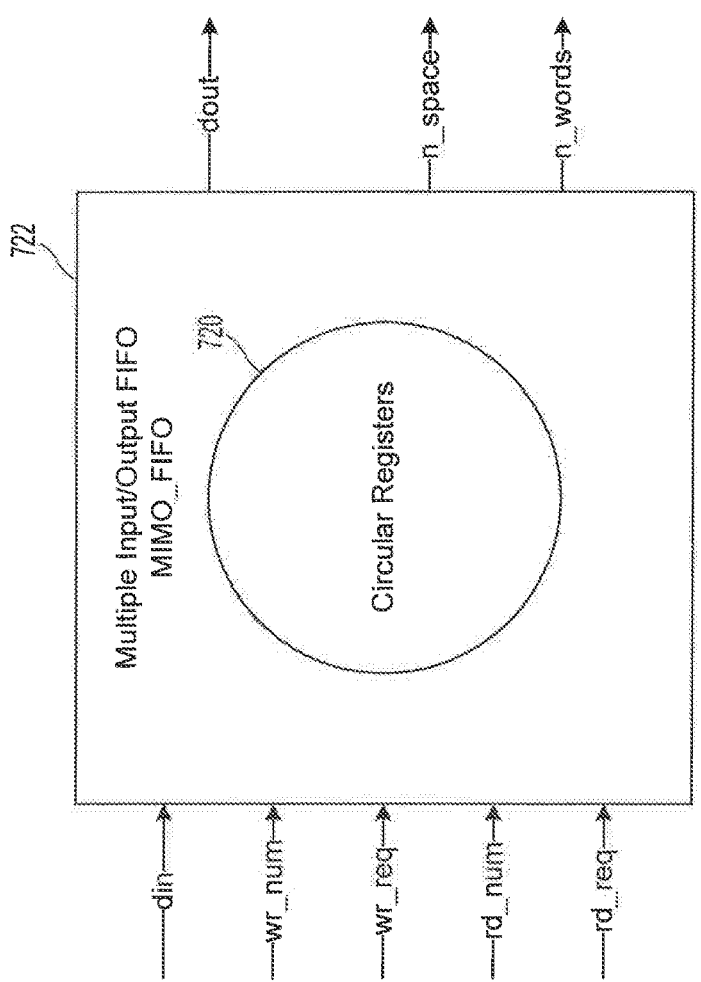
FIG. 7C is a block diagram illustrating a MIMO_FIFO memory register utilized by engines of the decoder of FIGS. 7A and 7B.

Turning now to FIG. 7C, the circular registers 720 employed by the engines may be operated as a MIMO_FIFO memory 722 having various inputs and outputs. For example, output signals of the MIMO_FIFO memory 722 may report an amount of available space n_space and a number of stored words n_words of memory 722. Additionally, input signals may include a number of words to be written wr_num, an input for data din, and a pulse wr_req to trigger writing the data din to the circular register 720. Also, input and output signals may include a number of words to be read out rd_num, an ouput for data dout, and a pulse rd_req to trigger reading the data dout from the circular register 720. Each of the engines may be provided with its own circular register.

Figure 8:
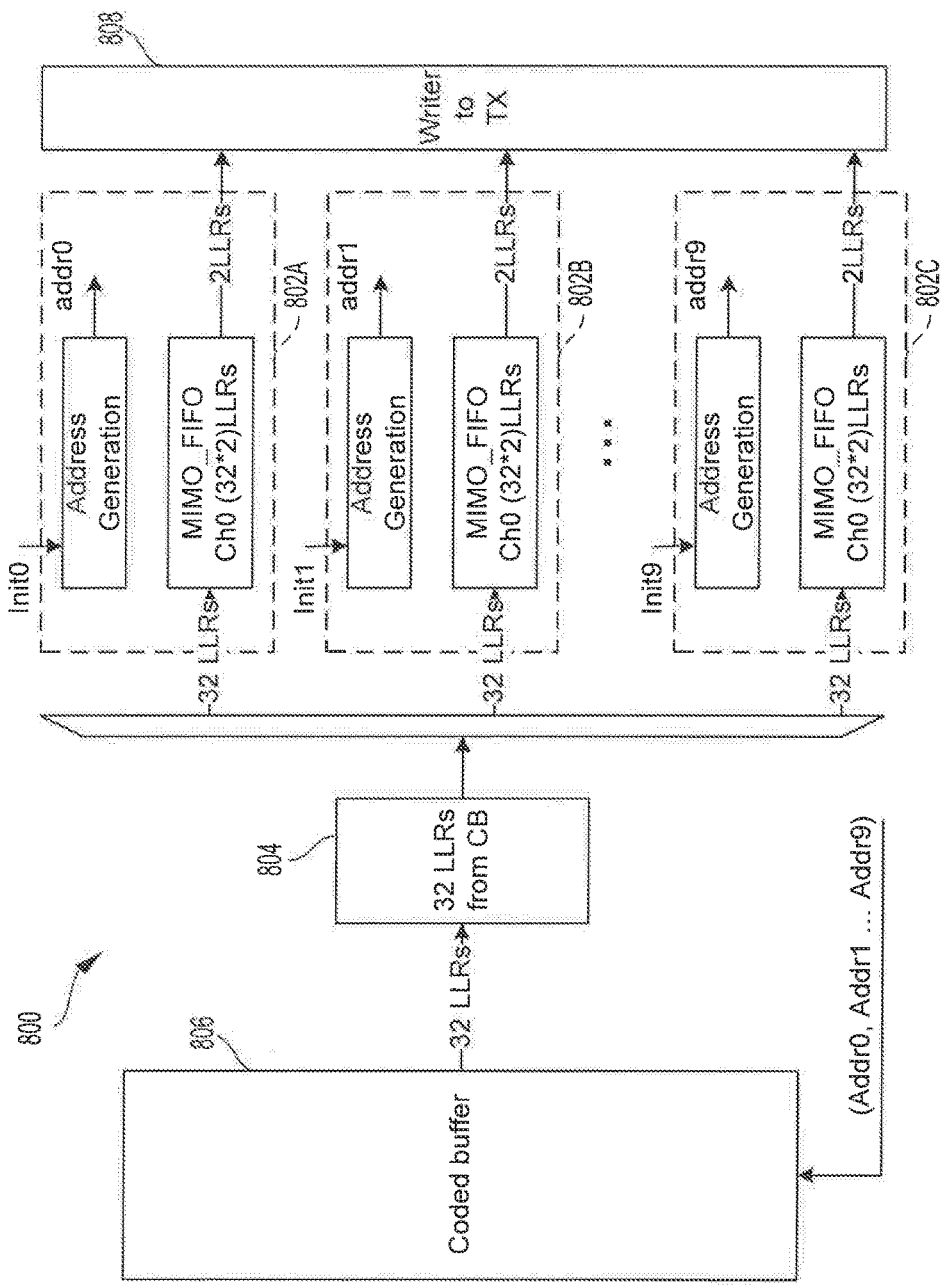
FIG. 8 is a block diagram illustrating an encoder according to some embodiments of the present disclosure.

Turning now to FIG. 8, an interleaver/rate-matcher 800 has up to ten interleaving and rate matching engines, illustrated by engines 802A, 802B, and 802C, that each read multiple copies of data 804 from different starting points in code block buffer 806. The input thirty-two LLRS are stored in the respective MIMO-FIFO buffers of the multiple engines 802A-802C, and the engines each provide two LLRs per cycle to a transmit buffer via writer block 808.

Turning now to FIG. 9, a method of performing data interleaving and rate matching for transmission includes reading, at block 900, input data of a code block buffer. The input data read at block 900 is read by a first interleaving and rate matching engine, starting at a first starting point of the code block buffer. As a result, the first interleaving and rate matching engine generates first interleaved and rate matched data at block 900. Processing may proceed from block 900 to block 902.

At block 902, input data of a code block buffer is read again. The input data read at block 900 is read by a second interleaving and rate matching engine, starting at a second starting point of the code block buffer. As a result, the second interleaving and rate matching engine generates second interleaved and rate matched data at block 902. Processing may proceed from block 902 to block 904.

At block 904, encoded data is provided that includes the first interleaved and rate matched data and the second interleaved and rate matched data. For example, block 904 may include writing the encoded output data to a transmit buffer. Processing may return from block 904 to block 900.

Blocks 900 and 902 may include employing a rectangular interleaver and/or employing, as an interleaver memory, a code block buffer having Log 2(constellation_size) number of rows. It should additionally be understood that blocks 900 and 902 may include causing the first interleaving and rate matching engine and the second interleaving and rate matching engine to each run on a different column or row of interleaver memory. It should further be understood that blocks 900 and 902 may include the first interleaving and rate matching engine and the second interleaving and rate matching engine to each run in parallel with a same coded bit size and different starting offsets. It should further be understood that additional blocks may be included that involve utilizing a number N of interleaving and rate matching engines equal to Log 2(constellation_size).

Referring now to FIG. 10, a method of processing received input data includes reading, at block 1000, input data of a log likelihood ratio (LLR) buffer. The reading at block 100 is performed by a first de-interleaving and de-rate matching engine, starting at a first starting point of the LLR buffer. As a result, first de-interleaved and de-rate matched data is generated at block 1000. Processing may proceed from block 1000 to block 1002.

At block 1002, input data of the LLR buffer is read by a second de-interleaving and de-rate matching engine acting in parallel with the first de-interleaving and de-rate matching engine. The reading is performed starting at a second starting point of the LLR buffer. As a result, second de-interleaved and de-rate matched data is generated at block 1002. Processing may proceed form block 1002 to block 1004.

At block 1004, the deinterleaved and de-rate-matched data is provided. The provided data includes the first de-interleaved and de-rate matched data and the second de-interleaved and de-rate matched data. For example, block 1004 may include causing the first de-interleaving and de-rate matching engine and the second de-interleaving and de-rate matching engine to write de-rate matching results in a Hybrid Automatic Repeat Request (HARQ) buffer in parallel, thereby combining previous data in the HARQ buffer.

Embodiments may also include alternative arrangements and features. For example, blocks 1000 and 1002 may include employing a rectangular interleaver and/or employing, as an interleaver memory, a code block buffer having Log 2(constellation_size) number of rows. Also, blocks 1000 and 1002 may include causing the first interleaving and rate matching engine and the second interleaving and rate matching engine to each run on a different column or row of interleaver memory. As another example, blocks 1000 and 1002 may include causing the first interleaving and rate matching engine and the second interleaving and rate matching engine to each run in parallel with a same coded bit size and different starting offsets. As yet another example, additional blocks may be included that involve utilizing a number N of de-interleaving and de-rate matching engines equal to Log 2(constellation_size).

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The functional blocks and modules described herein (e.g., the functional blocks and modules in FIGS. 2 and 6-10) may comprise processors, electronics devices, hardware devices, electronics components, logical circuits, memories, software codes, firmware codes, etc., or any combination thereof.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Skilled artisans will also readily recognize that the order or combination of components, methods, or interactions that are described herein are merely examples and that the components, methods, or interactions of the various aspects of the present disclosure may be combined or performed in ways other than those illustrated and described herein.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. Computer-readable storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, a connection may be properly termed a computer-readable medium. For example, if the software is transmitted from a website, server, or other remote source using a coaxial cable, fiber optic cable, twisted pair, or digital subscriber line (DSL), then the coaxial cable, fiber optic cable, twisted pair, or DSL, are included in the definition of medium. Disk and disc, as used herein, includes compact disc (CD), laser disc, optical disc, digital versatile disc (DVD), hard disk, solid state disk, and blu-ray disc where disks usually reproduce data magnetically, while discs reproduce data optically with lasers. Combinations of the above should also be included within the scope of computer-readable media.

As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C) or any of these in any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A method of interleaving and rate matching data for transmission, the method comprising:
   reading, for a block of encoded data on which interleaving after rate-matching is to be performed, the block of encoded data from a buffer, by a first interleaving and rate matching engine, starting at a first starting point of the buffer, to generate first interleaved after rate matched data;
   reading the block of encoded data from the buffer, by a second interleaving and rate matching engine acting in parallel with the first interleaving and rate matching engine, starting at a second starting point of the buffer, to generate second interleaved after rate matched data; and
   providing encoded output data that includes the first interleaved after rate matched data and the second interleaved after rate matched data.

2. The method of claim 1, comprising:
   employing, as an interleaver memory, a code block buffer having at least Log 2(constellation_size) number of columns or rows; and
   utilizing a number N of interleaving and rate matching engines equal to the at least Log 2(constellation_size) number of columns or rows.

3. The method of claim 2, comprising causing the first interleaving and rate matching engine and the second interleaving and rate matching engine to each run on a different column or row of the interleaver memory.

4. The method of claim 1, comprising causing the first interleaving and rate matching engine and the second interleaving and rate matching engine to each run in parallel with a same coded bit size and different starting offsets.

5. A method of deinterleaving and de-rate matching received data, the method comprising:
   reading data of a log likelihood ratio (LLR) buffer, by a first de-interleaving and de-rate matching engine, starting at a first starting point of the LLR buffer, to generate first de-interleaved before de-rate matched data;

reading the data of the LLR buffer, by a second de-interleaving and de-rate matching engine acting in parallel with the first de-interleaving and de-rate matching engine, starting at a second starting point of the LLR buffer, to generate second de-interleaved before de-rate matched data; and providing decoded output data that includes the first de-interleaved before de-rate matched data and the second de-interleaved before de-rate matched data.

6. The method of claim 5, comprising:

employing, as a deinterleaver memory, a code block buffer having at least Log 2(constellation_size) number of columns or rows; and utilizing a number N of deinterleaving and de-rate matching engines equal to the at least Log 2(constellation_size) number of columns or rows.

7. The method of claim 6, comprising causing the first deinterleaving and de-rate matching engine and the second deinterleaving and de-rate matching engine to each run on a different column or row of the deinterleaver memory.

8. The method of claim 5, comprising causing the first deinterleaving and de-rate matching engine and the second deinterleaving and de-rate matching engine to each run in parallel with a same coded bit size and different starting offsets.

9. The method claim 5, comprising causing the first de-interleaving and de-rate matching engine and the second de-interleaving and de-rate matching engine to write de-rate matching results in a Hybrid Automatic Repeat Request (HARQ) buffer in parallel, thereby combining previous data in the HARQ buffer.

10. An encoder, comprising:

at least one processor, at least one memory coupled to the at least one processor, wherein the at least one processor is configured to:

read, for a block of encoded data on which interleaving after rate-matching is to be performed, the block of encoded data from a buffer, by a first interleaving and rate matching engine, starting at a first starting point of the buffer, to generate first interleaved after rate matched data;

read the block of encoded data from the buffer, by a second interleaving and rate matching engine acting in parallel with the first interleaving and rate matching engine, starting at a second starting point of the buffer, to generate second interleaved after rate matched data; and provide encoded output data that includes the first interleaved after rate matched data and the second interleaved after rate matched data.

11. The encoder of claim 10, wherein the at least one processor is configured to:

employ, as an interleaver memory, a code block buffer having at least Log 2(constellation_size) number of columns or rows; and utilize a number N of interleaving and rate matching engines equal to the at least Log 2(constellation_size) number of columns or rows.

12. The encoder of claim 11, wherein the at least one processor is configured to cause the first interleaving and rate matching engine and the second interleaving and rate matching engine to each run on a different column or row of the interleaver memory.

13. The encoder of claim 10, wherein the at least one processor is configured to cause the first interleaving and rate matching engine and the second interleaving and rate matching engine to each run in parallel with a same coded bit size and different starting offsets.

14. A decoder, comprising:

at least one processor;

at least one memory coupled to the at least one processor, wherein the at least one processor is configured to:

read data of a log likelihood ratio (LLR) buffer, by a first de-interleaving and de-rate matching engine, starting at a first starting point of the LLR buffer, to generate first de-interleaved before de-rate matched data;

read the data of the LLR buffer, by a second de-interleaving and de-rate matching engine acting in parallel with the first de-interleaving and de-rate matching engine, starting at a second starting point of the LLR buffer, to generate second de-interleaved before de-rate matched data; and provide decoded output data that includes the first de-interleaved before de-rate matched data and the second de-interleaved before de-rate matched data.

15. The decoder of claim 14, wherein the at least one processor is configured to:

employ, as a deinterleaver memory, a code block buffer having at least Log 2(constellation_size) number of columns or rows; and utilize a number N of deinterleaving and de-rate matching engines equal to the at least Log 2(constellation_size) number of columns or rows.

16. The decoder of claim 15, wherein the at least one processor is configured to cause the first de-interleaving and de-rate matching engine and the second de-interleaving and de-rate matching engine to each run on a different column or row of the deinterleaver memory.

17. The decoder of claim 14, wherein the at least one processor is configured to cause the first de-interleaving and de-rate matching engine and the second de-interleaving and de-rate matching engine to each run in parallel with a same coded bit size and different starting offsets.

18. The decoder of claim 14, wherein the at least one processor is configured to cause the first de-interleaving and de-rate matching engine and the second de-interleaving and de-rate matching engine to write de-rate matching results in a Hybrid Automatic Repeat Request (HARQ) buffer in parallel, thereby combining previous data in the HARQ buffer.

* * * * *